(12) United States Patent
Chen et al.

(10) Patent No.: US 12,099,404 B2
(45) Date of Patent: Sep. 24, 2024

(54) METHOD FOR DETERMINING STRIPE CONSISTENCY AND APPARATUS

(71) Applicant: HUAWEI TECHNOLOGIES CO., LTD., Shenzhen (CN)

(72) Inventors: Liang Chen, Shenzhen (CN); Ruliang Dong, Hangzhou (CN); Jinyi Zhang, Hangzhou (CN); Qiang Liu, Hangzhou (CN); Qizhao Yuan, Chengdu (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 24 days.

(21) Appl. No.: 17/746,188

(22) Filed: May 17, 2022

(65) Prior Publication Data
US 2022/0276925 A1  Sep. 1, 2022

Related U.S. Application Data

(63) Continuation of application No. PCT/CN2020/126855, filed on Nov. 5, 2020.

(30) Foreign Application Priority Data

Nov. 20, 2019 (CN) .......................... 201911141650.7

(51) Int. Cl.
*G06F 11/10* (2006.01)
*G06F 9/30* (2018.01)
*G06F 9/50* (2006.01)

(52) U.S. Cl.
CPC ...... *G06F 11/1004* (2013.01); *G06F 9/30029* (2013.01); *G06F 9/5016* (2013.01)

(58) Field of Classification Search
CPC .. G06F 11/10; G06F 11/1004; G06F 11/1076; G06F 9/30029; G06F 9/5016; H03M 13/09; H03M 13/29
See application file for complete search history.

(56) References Cited

U.S. PATENT DOCUMENTS 8,910,031 B1 * 12/2014 Liu .................. H03M 13/09
                                                        714/766
9,846,615 B2 * 12/2017 da la Torre ......... G06F 16/2365
(Continued)

FOREIGN PATENT DOCUMENTS

CN      106681848 A      5/2017
CN      107273048 A     10/2017
(Continued)

OTHER PUBLICATIONS

Arslan, "Redundancy and Aging of Efficient Multidimensional MDS Parity-Protected Distributed Storage Systems", IEEE, Transactions on Device and Materials Reliability, vol. 14, No. 1, Mar. 2014, 11 Pages.

*Primary Examiner* — Albert Decady
*Assistant Examiner* — Enamul M Kabir
(74) *Attorney, Agent, or Firm* — Maier & Maier, PLLC (57) ABSTRACT

A method and apparatus for determining stripe consistency, including an operation node that obtains n groups of CRC data blocks corresponding to a target stripe, where the target stripe includes n first data blocks, the n first data blocks include k original data blocks and m EC data blocks of the k original data blocks, the n groups of CRC data blocks are respective CRC data blocks of n groups of second data blocks, one group of second data blocks includes m transformation results obtained by performing m times of EC transformation on one first data block, both k and m are positive integers, and n=m+k.

9 Claims, 5 Drawing Sheets

(56) References Cited

U.S. PATENT DOCUMENTS

| | | | |
|---|---|---|---|
| 2003/0237019 A1 | 12/2003 | Kleiman et al. | |
| 2010/0218037 A1* | 8/2010 | Swartz | G06F 16/00 714/6.12 |
| 2011/0314346 A1* | 12/2011 | Vas | H04L 9/3242 714/49 |
| 2015/0135006 A1* | 5/2015 | Samanta | G06F 11/2064 714/6.24 |
| 2017/0161148 A1* | 6/2017 | Vairavanathan | G06F 11/1004 |
| 2017/0206135 A1* | 7/2017 | Zeng | G06F 11/1076 |
| 2018/0293134 A1* | 10/2018 | Jin | G06F 11/1464 |
| 2018/0307560 A1* | 10/2018 | Vishnumolakala | G06F 3/067 |
| 2019/0347160 A1* | 11/2019 | Li | G06F 11/1004 |
| 2020/0133493 A1* | 4/2020 | Gao | G06F 3/0631 |

FOREIGN PATENT DOCUMENTS

| | | |
|---|---|---|
| CN | 107908499 A | 4/2018 |
| CN | 109992445 A | 7/2019 |
| EP | 2993585 A1 | 3/2016 |

\* cited by examiner

```
An operation node obtains n groups of CRC data blocks      S201
         corresponding to a target stripe
```

```
The operation node determines whether the n groups of CRC data    S202
            blocks meet a linear relationship
```

```
  If the n groups of CRC data blocks meet a linear relationship, the    S203
operation node determines that the target stripe has stripe consistency
```

METHOD FOR DETERMINING STRIPE CONSISTENCY AND APPARATUS

CROSS-REFERENCE TO RELATED APPLICATIONS

This application is a continuation of International Patent Application No. PCT/CN2020/126855 filed on Nov. 5, 2020, which claims priority to Chinese Patent Application No. 201911141650.7 filed on Nov. 20, 2019. The disclosures of the aforementioned applications are hereby incorporated by reference in their entireties.

TECHNICAL FIELD

Embodiments relate to the field of computer technologies, and to a method for determining stripe consistency and an apparatus.

BACKGROUND

An erasure code (EC) technology may be applied to a data storage system and is a data coding method that can reduce data redundancy and ensure data reliability.

In the storage system, for k data blocks, m parity-check data blocks of the k data blocks are first generated according to an EC algorithm (both k and m are positive integers greater than or equal to 1, and a value relationship between k and m is not limited). In this way, k+m data blocks are obtained. Then, the k+m data blocks are stored on different system nodes (for example, hard disks) in the data storage system. The k+m data blocks constitute a complete codeword (referred to as a stripe in the following) obtained through coding, and the k+m data blocks meet stripe consistency. To be specific, loss of any t ($1 \le t \le m$) data blocks in the k+m data blocks may be tolerated, to ensure that data can be recovered.

Currently, a method for determining whether a stripe in the storage system has consistency may include the following: The k+m data blocks are converged on one operation node from different system nodes. It is assumed that the k data blocks are respectively $D_0 \sim D_{k-1}$ and the m parity-check data blocks are respectively $P_0 \sim P_{m-1}$. The operation node determines m corresponding parity-check data blocks $\overline{P}_0 \sim \overline{P}_{m-1}$ of the k data blocks $D_0 \sim D_{k-1}$ according to the EC algorithm. Then, the operation node separately compares a parity-check data block $P_i$ and a parity-check data block $\overline{P}_i$ (i=0, 1, ... m−1) byte by byte. If $P_i$ and $\overline{P}_i$ are the same, the operation node determines that the stripe including $D_0 \sim D_{k-1}$ and $P_0 \sim P_{m-1}$ has stripe consistency. Otherwise, the stripe does not have stripe consistency.

However, in the foregoing method for determining stripe consistency, all the data blocks in the stripe are converged on one operation node from the system nodes. If the stripe includes a large quantity of data blocks, a large network bandwidth needs to be consumed. Consequently, overall performance of the data storage system may be affected.

SUMMARY

The embodiments provide a method for determining stripe consistency and an apparatus, so that network resources consumed for determining stripe consistency can be reduced.

To achieve the foregoing objective, the following solutions are used in the embodiments.

According to a first aspect, an embodiment provides a method for determining stripe consistency, where the method includes:

An operation node obtains n groups of cyclic redundancy check (CRC) data blocks corresponding to a target stripe, where the target stripe includes n first data blocks, the n first data blocks include k original data blocks and m EC data blocks of the k original data blocks, the n groups of CRC data blocks are respective CRC data blocks of n groups of second data blocks, one group of second data blocks in the p groups of second data blocks includes m transformation results obtained by performing m times of EC transformation on one corresponding first data block, both k and m are positive integers, and n=m+k. In addition, the operation node determines whether the n groups of CRC data blocks meet a linear relationship. If the n groups of CRC data blocks meet a linear relationship, the operation node determines that the target stripe has stripe consistency.

In the method for determining stripe consistency provided in this embodiment, the operation node determines whether the n groups of CRC data blocks corresponding to the target stripe meet a linear relationship, to determine whether the target stripe has stripe consistency. Because the CRC data block is much smaller than the first data block included in the target stripe, the operation node obtains the CRC data block corresponding to the target stripe from a system node, so that bandwidth consumption can be reduced. In addition, because the CRC data block is small, the operation node determines, based on the CRC data block, whether the target stripe has stripe consistency, so that a calculation amount of the operation node can be reduced, and resource consumption can be reduced. In conclusion, in the method for determining stripe consistency provided in this embodiment, network resources consumed for determining stripe consistency can be reduced.

In a possible implementation, a $j^{th}$ time of EC transformation is performed on each of the n first data blocks $\{B_0, B_1, \ldots, B_{n-1}\}$ included in the target stripe, to obtain n second data blocks $\{\tilde{B}_0^j, \tilde{B}_1^j, \ldots, \tilde{B}_{n-1}^j\}$ respective CRC data blocks of the n second data blocks $\{\tilde{B}_0^j, \tilde{B}_1^j, \ldots, \tilde{B}_{n-1}^j\}$ are $\{C_0^j, C_1^j, \ldots, C_{n-1}^j\}$, and j=1, 2, ..., m. The method in which the foregoing operation node determines whether the n groups of CRC data blocks meet a linear relationship may include: The operation node determines whether the n groups of CRC data blocks meet $C_0^j \oplus C_1^j \oplus \ldots \oplus C_{n-1}^j = 0$, where j=1, 2, ..., m, and $\oplus$ indicates an exclusive OR operation.

In a possible implementation, the method in which the foregoing operation node determines that the target stripe has stripe consistency may include: The operation node determines, based on whether the n groups of CRC data blocks meet a linear relationship, whether the n groups of second data blocks meet a linear relationship, and if the n groups of second data blocks meet a linear relationship, the operation node determines that the target stripe has stripe consistency.

In this embodiment, for one group of data blocks, if the group of data blocks meets a linear relationship, one group of CRC data blocks corresponding to the group of data blocks also meets a linear relationship. Conversely, if one group of CRC data blocks corresponding to the group of data blocks does not meet a linear relationship, the group of data blocks does not meet a linear relationship. If one group of CRC data blocks corresponding to the group of data blocks meets a linear relationship, the group of data blocks does not necessarily meet a linear relationship.

It should be noted that, in this embodiment, for the foregoing target stripe, if the foregoing n groups of CRC data blocks meet a linear relationship, a probability that the foregoing n groups of second data blocks meet a linear relationship is not less than (namely, greater than or equal to)

$$1 - \left(\frac{1}{2^{crclength}}\right)^m,$$

where m is a quantity of EC data blocks in the foregoing target stripe, and crclength indicates a bit quantity of one CRC data block.

In this embodiment, for one stripe, n data blocks included in the stripe are $B_0, B_1, \ldots, B_{n-1}$, a vector including the n data blocks is $[B_0\ B_1\ \ldots\ B_{n-2}\ B_{n-1}]$, and an EC transformation matrix H corresponding to the stripe is as follows:

$$H = \begin{bmatrix} h_{0,0} & h_{0,1} & \cdots & h_{0,n-2} & h_{0,n-1} \\ h_{1,0} & h_{1,1} & \cdots & h_{1,n-2} & h_{1,n-1} \\ \vdots & \vdots & \ddots & \vdots & \vdots \\ h_{m-1,0} & h_{m-1,1} & \cdots & h_{m-1,n-2} & h_{m-1,n-1} \end{bmatrix}$$

If the stripe has stripe consistency, the stripe meets an equation $H*v^T=0$:

$$\begin{bmatrix} h_{0,0} & h_{0,1} & \cdots & h_{0,n-2} & h_{0,n-1} \\ h_{1,0} & h_{1,1} & \cdots & h_{1,n-2} & h_{1,n-1} \\ \vdots & \vdots & \ddots & \vdots & \vdots \\ h_{m-1,0} & h_{m-1,1} & \cdots & h_{n-1,n-2} & h_{m-1,n-1} \end{bmatrix} \begin{bmatrix} B_0 \\ B_1 \\ \vdots \\ B_{n-2} \\ B_{n-1} \end{bmatrix} = 0$$

Further, the foregoing formula is expanded to obtain the following m equations:

$$\begin{cases} h_{0,0} * B_0 \oplus h_{0,1} * B_1 \oplus \ldots \oplus h_{0,n-2} * B_{n-2} \oplus h_{0,n-1} * B_{n-1} = 0 \\ h_{1,0} * B_0 \oplus h_{1,1} * B_1 \oplus \ldots \oplus h_{1,n-2} * B_{n-2} \oplus h_{1,n-1} * B_{n-1} = 0 \\ \ldots \\ h_{m-1,0} * B_0 \oplus h_{m-1,1} * B_1 \oplus \ldots \oplus h_{m-1,n-2} * B_{n-2} \oplus h_{m-1,n-1} * \\ \quad B_{n-1} = 0 \end{cases}$$

It may be understood from the m equations that:

$h_{i,0}*B_0 \oplus h_{i,1}*B_1 \oplus \ldots \oplus h_{i,n-2}*B_{n-2} \oplus h_{i,n-1}*B_{n-1}=0$ Because $h_{i,0}*B_0 \oplus h_{i,1}*B_1 \oplus \ldots \oplus h_{i,n-2}*B_{n-2} \oplus h_{i,n-1}*B_{n-1}=0$, it may be understood that $h_{i,0}*B_0, h_{i,1}*B, \ldots, h_{i,n-2}*B_{n-2}$, and $h_{i,n-1}*B_{n-1}$ meet a linear relationship.

In conclusion, it may be understood that if transformation results (transformation results obtained according to the EC transformation matrix) of all the data blocks in the stripe meet a linear relationship, the stripe has stripe consistency.

It should be noted that, because the foregoing n groups of CRC data blocks meet a linear relationship, a probability that the foregoing n groups of second data blocks meet a linear relationship is not less than (namely, greater than or equal to)

$$1 - \left(\frac{1}{2^{crclength}}\right)^m.$$

Therefore, in this embodiment, if the n groups of CRC data blocks meet a linear relationship, that the operation node determines that the target stripe has stripe consistency is as follows: If the n groups of CRC data blocks meet a linear relationship, the operation node determines that a probability that the target stripe meets stripe consistency is not less than $$1 - \left(\frac{1}{2^{crclength}}\right)^m.$$

In a possible implementation, in a process of determining whether the target stripe has stripe consistency, among M system nodes that store the n first data blocks in the target stripe, some system nodes may already store corresponding CRC data blocks (that is, the system node already determines a second data block based on a first data block in advance, and determines a CRC data block of the second data block), and some system nodes may store no corresponding CRC data block. In this case, the system node that stores no corresponding CRC data block first performs, based on a corresponding transformation coefficient in the EC transformation matrix, EC transformation on a first data block stored on the system node, to obtain a second data block, then determines a CRC data block of the second data block, and then sends the CRC data block to the operation node. In addition, the system node that already stores the corresponding CRC data block also sends, to the operation node, the CRC data block stored on the system node. In this way, the operation node obtains the CRC data block corresponding to the target stripe, and determines, based on the CRC data block corresponding to the target stripe, whether the target stripe has stripe consistency. It should be noted that an arrangement order of the CRC data blocks corresponding to the target stripe is consistent with an arrangement order of the n first data blocks in the target stripe.

According to a second aspect, an embodiment provides a method for determining stripe consistency, where the method includes: A system node performs EC transformation on p first data blocks on the system node, to obtain p groups of second data blocks, where the p first data blocks are data blocks in a target stripe, the target stripe includes n first data blocks, the n first data blocks are stored on at least one system node, the n first data blocks include k original data blocks and m EC data blocks of the k original data blocks, one group of second data blocks in the p groups of second data blocks includes m transformation results obtained by performing m times of EC transformation on one corresponding first data block, both k and m are positive integers, n=m+k, and p is a positive integer less than or equal to n. In addition, the system node determines respective CRC data blocks of the p groups of second data blocks, to obtain p groups of CRC data blocks, where the p groups of CRC data blocks are used to determine whether the target stripe has stripe consistency.

In this embodiment, each of system nodes that store the n first data blocks included in the target stripe needs to process the first data block on the system node, and methods in which the system nodes process the first data block are the same.

In a possible implementation, the method in which the foregoing system node performs EC transformation on one first data block may include: The system node determines m EC transformation coefficients that correspond to a first location and that are in an EC transformation matrix, where the first location is a location of the first data block in the target stripe. In addition, the system node performs EC transformation on the first data block based on the m EC transformation coefficients, to obtain one group of second data blocks.

In this embodiment, the n first data blocks in the target stripe are arranged in a specified order. In other words, each first data block has a corresponding location in the target stripe. That the system node determines m EC transformation coefficients that correspond to a first location and that are in an EC transformation matrix may include: The system node first determines the location (namely, the first location) of the first data block in the target stripe, and then determines, as the m EC transformation coefficients corresponding to the first data block, one column of elements that correspond to the location of the first data block and that are in the EC transformation matrix. The foregoing process of performing EC transformation on the first data block based on the m EC transformation coefficients is as follows: Each of the m EC transformation coefficients is multiplied by the first data block, to obtain m transformation results (namely, one group of second data blocks).

In a possible implementation, the method for determining stripe consistency provided in this embodiment may further include: The system node sends the p groups of CRC data blocks to an operation node.

After the system node determines the p groups of CRC data blocks, the system node may send the p groups of CRC data blocks to the operation node in a data storage system, to determine whether the target stripe has stripe consistency. Alternatively, the system node may store the p groups of CRC data blocks on the system node for subsequent use (for example, if necessary, the system node sends the CRC data block to an operation node, to determine stripe consistency).

In the method for determining stripe consistency provided in this embodiment, each system node may send the CRC data block corresponding to the target stripe to the operation node. Therefore, the system node does not need to send, to the operation node, all the data blocks included in the target stripe. In addition, the CRC data block is much smaller than the data block (the data block included in the target stripe is of a same size as the original data block, the original data block is a kilobyte (KB) data block, and the CRC data block is of tens of bits) included in the target stripe. In this way, network resources can be reduced when stripe consistency of the target stripe is determined based on the CRC data block corresponding to the target stripe.

According to a third aspect, an embodiment provides an operation node, including an obtaining module and a determining module. The obtaining module is configured to obtain n groups of CRC data blocks corresponding to a target stripe, where the target stripe includes n first data blocks, the n first data blocks include k original data blocks and m EC data blocks of the k original data blocks, the n groups of CRC data blocks are respective CRC data blocks of n groups of second data blocks, one group of second data blocks in the p groups of second data blocks includes m transformation results obtained by performing m times of EC transformation on one corresponding first data block, n is a positive integer greater than or equal to 2, m is a positive integer less than n, and n=m+k. The determining module is configured to: determine whether the n groups of CRC data blocks meet a linear relationship, and when the n groups of CRC data blocks meet a linear relationship, determine that the target stripe has stripe consistency.

In a possible implementation, a $j^{th}$ time of EC transformation is performed on each of the n first data blocks $\{B_0, B_1, \ldots, B_{n-1}\}$ included in the target stripe, to obtain n second data blocks $\{\tilde{B}_0^j, \tilde{B}_1^j, \ldots, \tilde{B}_{n-1}^j\}$, respective CRC data blocks of the n second data blocks $\{\tilde{B}_0^j, \tilde{B}_1^j, \ldots, \tilde{B}_{n-1}^j\}$ are $\{C_0^j, C_1^j, \ldots, C_{n-1}^j\}$, and j=1, 2, ..., m. The foregoing determining module is configured to determine whether the n groups of CRC data blocks meet $C_0^j \oplus C_1^j \oplus \ldots \oplus C_{n-1}^j = 0$, where j=1, 2, ..., m, and $\oplus$ indicates an exclusive OR operation.

In a possible implementation, the foregoing determining module is configured to: determine, based on whether the n groups of CRC data blocks meet a linear relationship, whether the n groups of second data blocks meet a linear relationship, and when the n groups of second data blocks meet a linear relationship, determine that the target stripe has stripe consistency.

According to a fourth aspect, an embodiment provides a system node, including a transformation module and a determining module. The transformation module is configured to perform EC transformation on p first data blocks on the system node, to obtain p groups of second data blocks, where the p first data blocks are data blocks in a target stripe, the target stripe includes n first data blocks, the n first data blocks are stored on at least one system node, the n first data blocks include k original data blocks and m EC data blocks of the k original data blocks, one group of second data blocks in the p groups of second data blocks includes m transformation results obtained by performing m times of EC transformation on one corresponding first data block, n is a positive integer greater than or equal to 2, m is a positive integer less than n, p is a positive integer less than or equal to n, and n=m+k. The determining module is configured to determine respective CRC data blocks of the p groups of second data blocks, to obtain p groups of CRC data blocks, where the p groups of CRC data blocks are used to determine whether the target stripe has stripe consistency.

In a possible implementation, the foregoing determining module is configured to determine m EC transformation coefficients that correspond to a first location and that are in an EC transformation matrix, where the first location is a location of the first data block in the target stripe. The foregoing transformation module is configured to perform EC transformation on the first data block based on the m EC transformation coefficients, to obtain one group of second data blocks.

In a possible implementation, the system node provided in this embodiment further includes a sending module, and the sending module is configured to send the p groups of CRC data blocks to an operation node.

According to a fifth aspect, an embodiment provides an operation node, including a processor and a memory connected to the processor through coupling, where the memory is configured to store computer instructions, and when the operation node runs, the processor executes the computer instructions stored in the memory, so that the operation node performs the method for determining stripe consistency according to any one of the first aspect and the possible implementations of the first aspect.

According to a sixth aspect, an embodiment provides an operation node, where the operation node exists in a product form of a chip. A structure of the operation node includes a processor and a memory, where the memory is configured to be coupled to the processor, the memory is configured to store computer instructions, and the processor is configured to execute the computer instructions stored in the memory, so that the operation node performs the method for determining stripe consistency according to any one of the first aspect and the possible implementations of the first aspect.

According to a seventh aspect, an embodiment provides a computer-readable storage medium, where the computer-readable storage medium may include computer instructions, and when the computer instructions are run on a computer, an operation node is enabled to perform the method for determining stripe consistency according to any one of the first aspect and the possible implementations of the first aspect.

According to an eighth aspect, an embodiment provides a system node, including a processor and a memory connected to the processor through coupling, where the memory is configured to store computer instructions, and when the system node runs, the processor executes the computer instructions stored in the memory, so that the system node performs the method for determining stripe consistency according to any one of the second aspect and the possible implementations of the second aspect.

According to a ninth aspect, an embodiment provides a system node, where the system node exists in a product form of a chip. A structure of the system node includes a processor and a memory, where the memory is configured to be coupled to the processor, the memory is configured to store computer instructions, and the processor is configured to execute the computer instructions stored in the memory, so that the system node performs the method for determining stripe consistency according to any one of the second aspect and the possible implementations of the second aspect.

According to a tenth aspect, an embodiment provides a computer-readable storage medium, where the computer-readable storage medium may include computer instructions, and when the computer instructions are run on a computer, a system node is enabled to perform the method for determining stripe consistency according to any one of the second aspect and the possible implementations of the second aspect.

It should be understood that, for beneficial effects achieved by the solutions in the third aspect to the tenth aspect and the corresponding possible implementations in the embodiments, refer to the foregoing effects in the first aspect, the second aspect, and the corresponding possible implementations. Details are not described herein again.

DETAILED DESCRIPTION OF THE EMBODIMENTS

The term "and/or" in the embodiments describes only an association relationship for associated objects and represents that three relationships may exist. For example, A and/or B may represent the following three cases: only A exists, both A and B exist, and only B exists.

In the embodiments, the terms "first", "second", and the like are intended to distinguish between different objects but do not indicate a particular order of the objects. For example, a first data block, a second data block, and the like are used to distinguish between different data blocks but are not used to describe a specified order of data blocks.

In the embodiments, the word "example" or "for example" is used to represent giving an example, an illustration, or a description. Any embodiment or design scheme described as an "example" or "for example" in the embodiments should not be explained as being more preferred or having more advantages than another embodiment or design scheme. Exactly, use of the terms such as "example" or "for example" is intended to present a related concept in a specific manner.

In the description of the embodiments, unless otherwise stated, "a plurality of" means two or more than two. For example, a plurality of processing units are two or more processing units. A plurality of systems are two or more systems.

First, some concepts used in a method for determining stripe consistency and an apparatus that are provided in the embodiments are explained.

Figure 1:
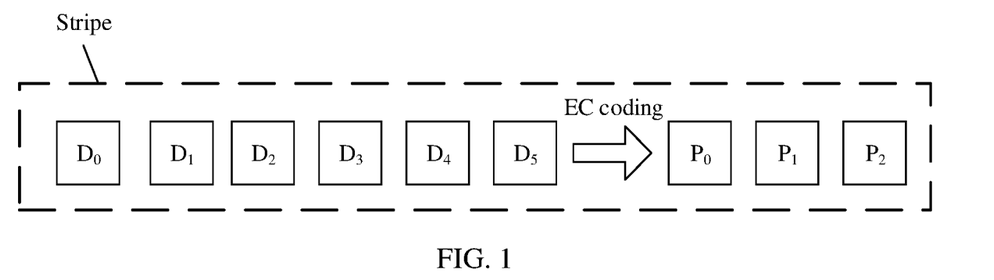
FIG. 1 is a schematic diagram of a stripe according to an embodiment.

Stripe: A data block (for ease of description, to-be-coded data blocks herein are collectively referred to as original data blocks in the embodiments) is coded by using an EC technology, to obtain an EC data block (namely, a data block obtained through coding according to an EC algorithm, where the data block may also be referred to as a parity-check data block), and a complete codeword that is obtained through coding and that includes the original data block and the EC data block is referred to as a stripe. For example, if there are k original data blocks, there are m EC data blocks corresponding to the k original data blocks (in the embodiments, a value relationship between k and m is not limited). As shown in FIG. 1, it is assumed that k=6, m=3, the six original data blocks are respectively denoted as $D_0$, $D_1$, $D_2$, $D_3$, $D_4$, and $D_5$, and the three EC data blocks corresponding to the six original data blocks are respectively denoted as $P_0$, $P_1$, and $P_2$. In this way, the nine data blocks constitute one stripe (namely, one storage array).

It should be understood that, in a storage system, k+m data blocks in one stripe may be stored on M system nodes (for example, hard disks), and M is a positive integer less than or equal to k+m.

It should be noted that coding the k original data blocks according to the EC algorithm includes: coding the k original data blocks according to a predetermined coding matrix (or may be referred to as an EC transformation matrix or a check matrix), to obtain the m EC data blocks. In the embodiments, a stripe obtained through EC coding has stripe consistency. In other words, all data blocks in the stripe meet the following formula (1):

$$H * v^T = 0 \tag{1}$$

where H is a predetermined EC transformation matrix (m×n dimensions), $v^T$ represents a transposition of a vector v, v is an n-dimensional vector including all the data blocks in the stripe, and $v=[D_0\ D_1\ \ldots\ D_{k-2}\ D_{k-1}\ P_0\ \ldots\ P_{m-1}]$.

For example, the EC transformation matrix is as follows:

$$H = \begin{bmatrix} h_{0,0} & h_{0,1} & \cdots & h_{0,n-2} & h_{0,n-1} \\ h_{1,0} & h_{1,1} & \cdots & h_{1,n-2} & h_{1,n-1} \\ \vdots & \vdots & \ddots & \vdots & \vdots \\ h_{m-1,0} & h_{0,1} & \cdots & h_{m-1,n-2} & h_{m-1,n-1} \end{bmatrix}$$

Based on the EC transformation matrix H, in the embodiments, it is specified that the foregoing formula (1) is expanded to obtain m equations in the following formula (2):

$$\begin{cases} h_{0,0} * D_0 \oplus h_{0,1} * D_1 \oplus \ldots \oplus h_{0,k-1} * D_{k-1} \oplus h_{0,k} * P_0 \oplus \ldots \oplus \\ \quad h_{0,n-1} * P_{m-1} = 0 \\ h_{1,0} * D_0 \oplus h_{1,1} * D_1 \oplus \ldots \oplus h_{1,k-1} * D_{k-1} \oplus h_{1,k} * P_0 \oplus \ldots \oplus \\ \quad h_{1,n-1} * P_{n-1} = 0 \\ \quad \ldots \\ h_{m-1,0} * D_0 \oplus h_{m-1,1} * D_1 \oplus \ldots \oplus h_{m-1,k-1} * D_{k-1} \oplus \\ \quad h_{m-1,k} * P_0 \oplus \ldots \oplus h_{m-1,n-1} * P_{m-1} = 0 \end{cases} \quad (2)$$

It should be understood that, for the k original data blocks, the m EC data blocks corresponding to the k original data blocks may be solved based on the formula (2), to obtain the stripe including the k original data blocks and the m EC data blocks. In the embodiments, for a stripe obtained by using the EC technology, an EC transformation matrix in the EC algorithm is referred to as an EC transformation matrix corresponding to the stripe.

Stripe consistency: Stripe consistency means that a stripe has a fault tolerance capability. For example, any t ($1 \leq t \leq m$) data blocks in the k+m data blocks are allowed to be lost, and when the any t data blocks are lost, recovery of the original data blocks can be ensured. For example, in the nine data blocks $D_0$, $D_1$, $D_2$, $D_3$, $D_4$, $D_5$, $P_0$, $P_1$, and $P_2$ in the stripe (in the stripe, m=3) shown in FIG. 1, when the data blocks $D_0$, $D_4$, and $P_1$ are lost, the data blocks $D_0$, $D_4$, and $P_1$ may be recovered based on the data blocks $D_1$, $D_2$, $D_3$, $D_5$, $P_0$, and $P_2$. In this way, information integrity of the original data blocks (including $D_0$, $D_1$, $D_2$, $D_3$, $D_4$, and $D_5$) can be ensured. This means that the stripe has stripe consistency.

EC transformation: In the embodiments, performing EC transformation on a data block in a stripe means transforming the data block in the stripe according to the foregoing EC transformation matrix. For example, for one data block in the stripe, performing EC transformation on the data block means transforming the data block by using a transformation coefficient that (there may be a plurality of transformation coefficients) corresponds to the data block and that is in the EC transformation matrix.

In view of the problem in the background, the embodiments provide a method for determining stripe consistency and an apparatus. An operation node in a data storage system determines whether n groups of CRC data blocks of n groups of second data blocks corresponding to a target stripe meet a linear relationship, to determine whether the target stripe has stripe consistency, so that network resources consumed by determining stripe consistency can be reduced.

A node (which may also be referred to as a system node) in the data storage system has a storage function and a data operation capability. In the data storage system, some nodes are used to store data, and some nodes are used to process data.

In the embodiments, n data blocks in the target stripe are stored on M system nodes. It should be understood that in the following embodiments, the operation node may be one of the M system nodes, or the operation node may be another system node (namely, one of system nodes other than the foregoing M system nodes) in the data storage system. The operation node may be determined based on an actual situation. This is not limited in the embodiments.

Figure 2:
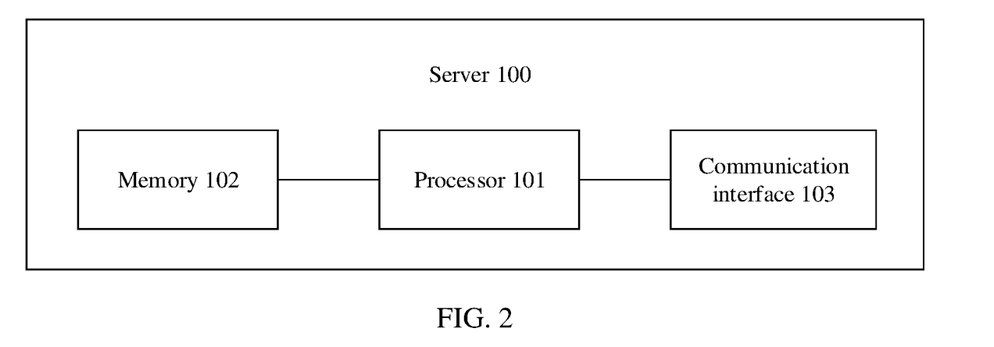
FIG. 2 is a schematic diagram of hardware of a server according to an embodiment.

In the embodiments, the system node may be integrated into a server, to implement a function of the system node. With reference to FIG. 2, the following describes components of a server that is integrated with the function of the system node and that is provided in an embodiment. As shown in FIG. 2, the server 100 may include a processor 101, a memory 102, a communications interface 103, and the like.

The processor 101 is a core component of the server 100 and is configured to run an operating system of the server 100 and an application (including a system application and a third-party application) in the server 100. In the embodiments, the processor 101 may be configured to: determine an EC data block of a data block, determine a CRC data block of a data block, and the like.

In the embodiments, the processor 101 may be a central processing unit (CPU), a general purpose processor, a digital signal processor (DSP), an application-specific integrated circuit (ASIC), a field programmable gate array (FPGA), another programmable logic device, a transistor logic device, a hardware component, or any combination thereof. The processor may implement or execute various example logic blocks, modules, and circuits described with reference to content disclosed in the embodiments. Alternatively, the processor may be a combination of processors implementing a computing function, for example, a combination of one or more microprocessors, or a combination of a DSP and a microprocessor.

The memory 102 may be configured to store a software program and a module. The processor 101 runs the software program and the module that are stored in the memory 102, to execute various function applications of the server 100 and process data. The memory 102 may include one or more computer-readable storage media. The memory 102 includes a program storage area and a data storage area. The program storage area may store an operating system, an application program required by at least one function, and the like. The data storage area may store data created by the server 100 and the like, for example, store an EC data block or a CRC data block of a data block included in a target stripe.

In the embodiments, the memory 102 may include a volatile memory, for example, a random access memory (RAM); or may include a non-volatile memory, for example, a read-only memory (ROM), a flash memory, a hard disk drive (HDD), or a solid-state drive (SSD); or may include a combination of the foregoing types of memories.

The communications interface 103 is an interface circuit used for communication between the server 100 and another device. The communications interface may be a structure that has a receiving/sending function, such as a transceiver or a transceiver circuit. For example, data is transmitted between different system nodes through the communications interface 103.

In the data storage system, the target stripe includes n data blocks, the n data blocks include k original data blocks and m EC data blocks of the k original data blocks, both k and m are positive integers, and n=m+k. It should be understood that, in the embodiments, after the k original data blocks are coded according to an EC algorithm to obtain the m EC data blocks, the obtained n data blocks (the k+m data blocks constitute the target stripe) are all referred to as first data blocks, and the n first data blocks are stored on at least one (for example, M, where M is a positive integer less than or equal to n) system node.

The method for determining stripe consistency provided in the embodiments may include two processes, and the two processes are respectively a process in which each of the system nodes that store the n first data blocks included in the target stripe processes the first data block stored on the system node and a process in which the operation node determines, based on a result obtained after the n first data blocks are processed, whether the target stripe has stripe consistency.

The two processes are separately described in detail below, to describe the method for determining stripe consistency provided in the embodiments.

In the embodiments, each system node that stores the first data block needs to process the first data block on the system node, and methods in which all the system nodes process the first data block are the same. One system node in all the system nodes that store the first data blocks is used as an example to describe a process in which the system node processes the first data block.

Figure 3:
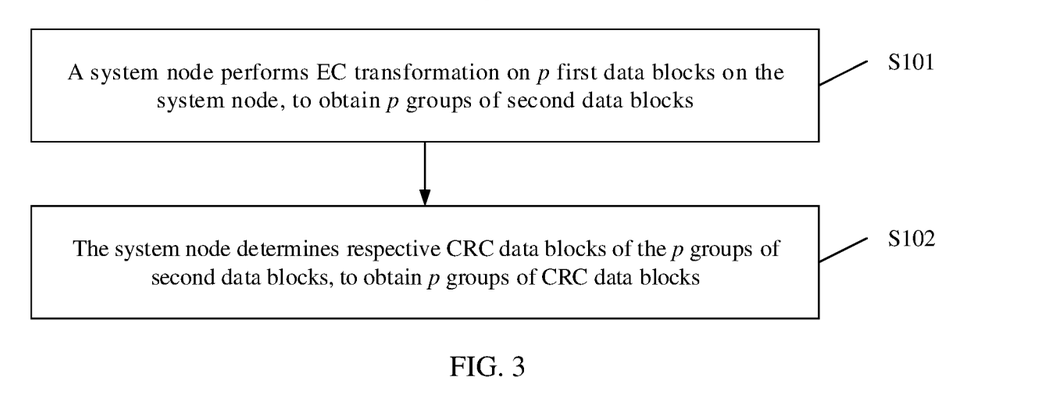
FIG. 3 is a schematic diagram of a data processing process according to an embodiment.

As shown in FIG. 3, a process in which a system node processes a first data block includes S101 and S102.

S101. The system node performs EC transformation on p first data blocks on the system node, to obtain p groups of second data blocks.

In S101, p is a positive integer less than or equal to n, n first data blocks (including k original data blocks and m EC data blocks of the k original data blocks, where n=m+k) included in a target stripe are stored on at least one system node. Optionally, one system node may store one first data block, or may store a plurality of first data blocks (for example, store p first data blocks).

In this embodiment, the system node performs EC transformation on each of the p first data blocks stored on the system node, to obtain the p groups of second data blocks. It may be understood that methods in which the system node performs EC transformation on all the first data blocks are similar, and performing EC transformation on the first data block means transforming the first data block by using m coefficients (which may be referred to as m EC transformation coefficients) that correspond to the first data block and that are in an EC transformation matrix corresponding to the target stripe.

One first data block corresponds to one group of second data blocks. One group of second data blocks includes m transformation results obtained by performing m times of EC transformation on one first data block. In other words, one group of second data blocks includes m transformation results (each data block in the EC transformation results is of a same size as the first data block) obtained by transforming one corresponding first data block m times by using m transformation coefficients that correspond to the first data block and that are in the EC transformation matrix.

An EC transformation process is described below by using an example in which the system node performs EC transformation on one first data block. For example, that the system node performs EC transformation on the first data block may include S1011 and S1012.

S1011. The system node determines m EC transformation coefficients that correspond to a first location and that are in the EC transformation matrix, where the first location is a location of the first data block in the target stripe.

It should be noted that, in this embodiment, the n first data blocks in the target stripe are arranged in a specified order. In other words, each first data block has a corresponding location in the target stripe, and the EC transformation matrix in S1011 has a same concept as that of the EC transformation matrix described at the foregoing related concept description part.

In this embodiment, EC transformation is performed, according to the EC transformation matrix in an EC algorithm, on the n first data blocks included in the target stripe. For one first data block, m EC transformation coefficients that correspond to the first data block and that are in the EC transformation matrix are first determined, and then m times of EC transformation are performed on the first data block by using the m EC transformation coefficients.

Figure 4:
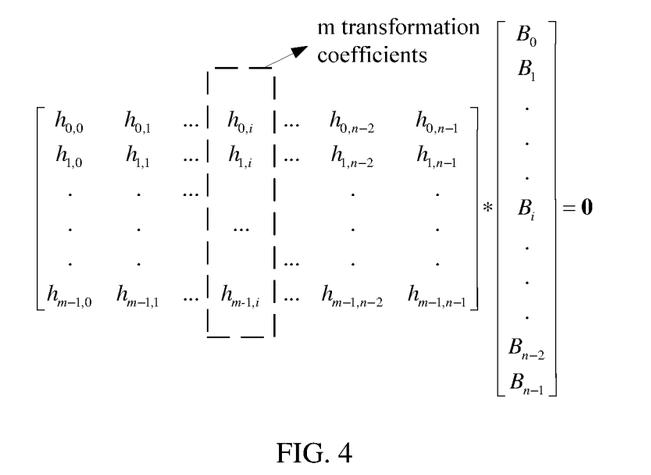
FIG. 4 is a schematic diagram of an EC transformation coefficient according to an embodiment.

The foregoing first location is the location (referred to as the first location in the following) of the first data block in the target stripe. Optionally, the first location may be a location index of the first data block in the target stripe. For example, that the system node determines m EC transformation coefficients that correspond to a first location and that are in the EC transformation matrix may include: The system node first determines the location (namely, the first location) of the first data block in the target stripe, and then determines, as the m EC transformation coefficients corresponding to the first data block, one column of elements that correspond to the location of the first data block and that are in the EC transformation matrix. For example, it is assumed that the n first data blocks in the target stripe are respectively $B_0, B_1, \ldots, B_{n-1}$, and a location of a data block $B_i$ in the n first data blocks is i. In this case, m elements corresponding to an $i^{th}$ column of the EC transformation matrix are m EC transformation coefficients. With reference to FIG. 4, the m EC transformation coefficients are $h_{0,i}, h_{1,i}, \ldots, h_{m-1,i}$.

S1012. The system node performs EC transformation on the first data block based on the m EC transformation coefficients, to obtain one group of second data blocks.

In this embodiment, the process of performing EC transformation on the first data block based on the m EC transformation coefficients is as follows: Each of the m EC transformation coefficients is multiplied by the first data block, to obtain m transformation results (namely, one group of second data blocks). Based on the foregoing example, if the m EC transformation coefficients of the first data block $B_i$ are $h_{0,i}, h_{1,i}, \ldots, h_{m-1,i}$, one group of second data blocks obtained after EC transformation is $h_{0,i}B_i, h_{1,i}B_i, \ldots, h_{m-1,i}B_i$, where $h_{0,i}B_i$ indicates a result obtained after the first time of EC transformation, $h_{1,i}B_i$ indicates a result obtained after the second time of EC transformation, and by analogy, $h_{m-1,i}B_i$ is a result obtained after an $m^{th}$ time of EC transformation.

In conclusion, based on the process described in the foregoing S1011 and S1012, the p groups of second data blocks corresponding to the p first data blocks on the system node may be obtained.

S102. The system node determines respective CRC data blocks of the p groups of second data blocks, to obtain p groups of CRC data blocks.

The p groups of CRC data blocks are used to determine whether the target stripe has stripe consistency. In this embodiment, after the system node determines the p groups of CRC data blocks, the system node may store the p groups of CRC data blocks on the system node or may send the p groups of CRC data blocks to an operation node in a data storage system, to determine whether the target stripe has stripe consistency.

Optionally, in this embodiment, the CRC data block of the second data block may be calculated by using an existing method, and details are not described herein again.

In conclusion, after each of system nodes that store the n first data blocks included in the target stripe processes, based on the method in S101 and S102, the first data block stored on the system node, the system node may store the CRC data block obtained by the system node, or if necessary, the system node sends the CRC data block to an operation node.

In this embodiment, each system node may send the CRC data block corresponding to the target stripe to the operation node. Therefore, the system node does not need to send, to the operation node, all the data blocks included in the target stripe. In addition, the CRC data block is much smaller than the data block (the data block included in the target stripe is of a same size as the original data block, the original data block is a kilobyte (KB) data block, and the CRC data block is of tens of bits) included in the target stripe. In this way, network resources can be reduced when stripe consistency of the target stripe is determined based on the CRC data block corresponding to the target stripe.

Figure 5:
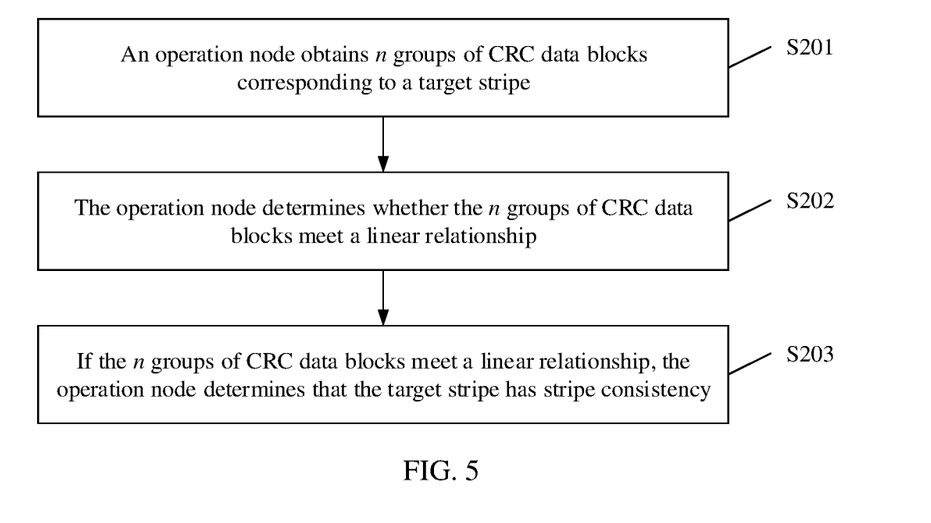
FIG. 5 is a schematic diagram 1 of a method for determining stripe consistency according to an embodiment.

Based on the CRC data blocks corresponding to the n first data blocks in the target stripe, the following method is used to determine whether the target stripe has stripe consistency. For example, as shown in FIG. 5, a method for determining stripe consistency provided in an embodiment may include S201 to S203.

S201. An operation node obtains n groups of CRC data blocks corresponding to a target stripe.

Optically, in this embodiment, the operation node may be one of system nodes that store n first data blocks, or the operation node may be another system node (namely, a node other than system nodes that store n first data blocks) in a data storage system. For example, the n first data blocks in the target stripe are stored on M system nodes, and when the operation node is one of the M system nodes, the process in which the operation node obtains the n groups of CRC data blocks corresponding to the target stripe includes the following: The operation node reads a CRC data block (a transformation block of the first data block, namely, a CRC data block of a second data block) that corresponds to the target stripe and that is stored on the operation node. In addition, the operation node receives CRC data blocks corresponding to the target stripe from the other M−1 system nodes.

When the operation node is a node other than the foregoing M system nodes, the process in which the operation node obtains the n groups of CRC data blocks corresponding to the target stripe includes the following: The operation node receives the n groups of CRC data blocks corresponding to the target stripe from the M system nodes.

For ease of understanding, the following Table 1 shows a relationship among the n first data blocks, n groups of second data blocks, and the n groups of CRC data blocks, where the n first data blocks are respectively $B_0, B_1, \ldots, B_{n-1}$.

TABLE 1

| First data block | Second data block | CRC data block of a second data block |
|---|---|---|
| $B_0$ | $\tilde{B}_0^1, \tilde{B}_0^2, \ldots, \tilde{B}_0^m$ | $C_0^1, C_0^2, \ldots, C_0^m$ |
| $B_1$ | $\tilde{B}_1^1, \tilde{B}_1^2, \ldots, \tilde{B}_1^m$ | $C_1^1, C_1^2, \ldots, C_1^m$ |
| ... | ... | ... |
| $B_{n-1}$ | $\tilde{B}_{n-1}^1, \tilde{B}_{n-1}^2, \ldots, \tilde{B}_{n-1}^m$ | $C_{n-1}^1, C_{n-1}^2, \ldots, C_{n-1}^m$ |

S202. The operation node determines whether the n groups of CRC data blocks meet a linear relationship.

With reference to the foregoing Table 1, the n first data blocks included in the target stripe are $\{B_0, B_1, \ldots, B_{n-1}\}$, a $j^{th}$ time of EC transformation is performed on each of the n first data blocks, to obtain n second data blocks $\{\tilde{B}_0^j, \tilde{B}_1^j, \ldots, \tilde{B}_{n-1}^j\}$, respective CRC data blocks of the n second data blocks $\{\tilde{B}_0^j, \tilde{B}_1^j, \ldots, \tilde{B}_{n-1}^j\}$ are $\{C_0^j, C_1^j, \ldots, C_{n-1}^j\}$, and j=1, 2, ..., m.

Optionally, the method in which the operation node determines whether the n groups of CRC data blocks meet a linear relationship may include: The operation node determines whether the n groups of CRC data blocks meet $C_0^j \oplus C_1^j \oplus \ldots \oplus C_{n-1}^j = 0$, where j=1, 2, ..., m, and $\oplus$ indicates an exclusive OR operation. It may be understood that the continuous exclusive OR operation may be referred to as an exclusive OR sum of all data blocks:

$$\begin{cases} C_0^1 \oplus C_1^1 \oplus \ldots \oplus C_{n-1}^1 = 0 \\ C_0^2 \oplus C_1^2 \oplus \ldots \oplus C_{n-1}^2 = 0 \\ \ldots \\ C_0^m \oplus C_1^m \oplus \ldots \oplus C_{n-1}^m = 0 \end{cases} \quad (3)$$

When m equations in the foregoing formula (3) are all valid, it indicates that the n groups of CRC data blocks meet a linear relationship.

It should be understood that, in this embodiment, if n data blocks meet a linear relationship, an exclusive OR sum of the n data blocks is 0. Similarly, if an exclusive OR sum of n data blocks is 0, the n data blocks meet a linear relationship.

S203. If the n groups of CRC data blocks meet a linear relationship, the operation node determines that the target stripe has stripe consistency.

Figure 6:
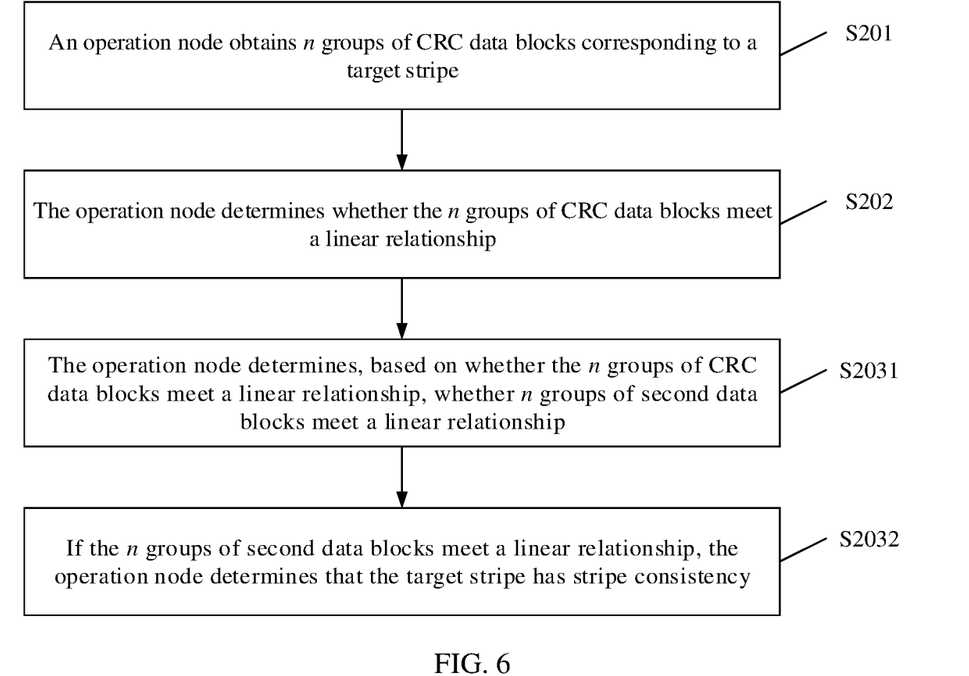
FIG. 6 is a schematic diagram 2 of a method for determining stripe consistency according to an embodiment.

With reference to FIG. 5, as shown in FIG. 6, the foregoing S203 may be implemented by using S2031 and S2032.

S2031. The operation node determines, based on whether the n groups of CRC data blocks meet a linear relationship, whether the n groups of second data blocks meet a linear relationship.

In this embodiment, for one group of data blocks, if the group of data blocks meets a linear relationship, one group of CRC data blocks corresponding to the group of data blocks also meets a linear relationship. Conversely, if one group of CRC data blocks corresponding to the group of data blocks does not meet a linear relationship, the group of data blocks does not meet a linear relationship. If one group of CRC data blocks corresponding to the group of data blocks meets a linear relationship, the group of data blocks does not necessarily meet a linear relationship.

It should be noted that, in this embodiment, for the foregoing target stripe, if the foregoing n groups of CRC data blocks meet a linear relationship, a probability that the foregoing n groups of second data blocks meet a linear relationship is not less than (namely, greater than or equal to)

$$1 - \left(\frac{1}{2^{crclength}}\right)^m,$$

where m is a quantity of EC data blocks in the foregoing target stripe, and crclength indicates a bit quantity of one CRC data block. For example, a size of the CRC data block is 16 bits or 32 bits.

S2032. If the n groups of second data blocks meet a linear relationship, the operation node determines that the target stripe has stripe consistency.

In this embodiment, for one stripe, n data blocks included in the stripe are $B_0, B_1, \ldots, B_{n-1}$, a vector including the n data blocks is $[B_0\ B_1\ \ldots\ B_{n-2}\ B_{n-1}]$, and an EC transformation matrix H corresponding to the stripe is as follows:

$$H = \begin{bmatrix} h_{0,0} & h_{0,1} & \cdots & h_{0,n-2} & h_{0,n-1} \\ h_{1,0} & h_{1,1} & \cdots & h_{1,n-2} & h_{1,n-1} \\ \vdots & \vdots & \ddots & \vdots & \vdots \\ h_{m-1,0} & h_{m-1,1} & \cdots & h_{m-1,n-2} & h_{m-1,n-1} \end{bmatrix}$$

Based on the related description in the foregoing embodiment, if the stripe has stripe consistency, the stripe meets an equation $H*v^T=0$:

$$\begin{bmatrix} h_{0,0} & h_{0,1} & \cdots & h_{0,n-2} & h_{0,n-1} \\ h_{1,0} & h_{1,1} & \cdots & h_{1,n-2} & h_{1,n-1} \\ \vdots & \vdots & \ddots & \vdots & \vdots \\ h_{m-1,0} & h_{m-1,1} & \cdots & h_{n-1,n-2} & h_{m-1,n-1} \end{bmatrix} \begin{bmatrix} B_0 \\ B_1 \\ \vdots \\ B_{n-2} \\ B_{n-1} \end{bmatrix} = 0$$

Further, the foregoing formula is expanded to obtain the following m equations:

$$\begin{cases} h_{0,0}*B_0 \oplus h_{0,1}*B_1 \oplus \ldots \oplus h_{0,n-2}*B_{n-2} \oplus h_{0,n-1}*B_{n-1} = 0 \\ h_{1,0}*B_0 \oplus h_{1,1}*B_1 \oplus \ldots \oplus h_{1,n-2}*B_{n-2} \oplus h_{1,n-1}*B_{n-1} = 0 \\ \ldots \\ h_{m-1,0}*B_0 \oplus h_{m-1,1}*B_1 \oplus \ldots \oplus h_{m-1,n-2}*B_{n-2} \oplus h_{m-1,n-1}* \\ \qquad B_{n-1} = 0 \end{cases}$$

It may be understood from the m equations that:

$h_{i,0}*B_0 \oplus h_{i,1}*B_1 \oplus \ldots \oplus h_{i,n-2}*B_{n-2} \oplus h_{i,n-1}*B_{n-1} = 0$ Because $h_{i,0}*B_0 \oplus h_{i,1}*B_1 \oplus \ldots \oplus h_{i,n-2}*B_{n-2} \oplus h_{i,n-1}*B_{n-1}=0$, it may be understood that $h_{i,0}*B_0$, $h_{i,1}*B_1, \ldots$, $h_{i,n-2}*B_{n-2}$, and $h_{i,n-1}*B_{n-1}$ meet a linear relationship.

In conclusion, it may be understood that if transformation results (transformation results obtained according to the EC transformation matrix) of all the data blocks in the stripe meet a linear relationship, the stripe has stripe consistency.

In this embodiment, EC transformation is performed, according to the EC transformation matrix, on the n first data blocks included in the target stripe, to obtain the n groups of second data blocks that meet a linear relationship. In addition, because the n groups of second data blocks meet a linear relationship, it may be determined that the target stripe has stripe consistency.

It should be noted that, because the foregoing n groups of CRC data blocks meet a linear relationship, a probability that the foregoing n groups of second data blocks meet a linear relationship is not less than (namely, greater than or equal to)

$$1 - \left(\frac{1}{2^{crclength}}\right)^m.$$

Therefore, in this embodiment, if the n groups of CRC data blocks meet a linear relationship, that the operation node determines that the target stripe has stripe consistency is as follows: If the n groups of CRC data blocks meet a linear relationship, the operation node determines that a probability that the target stripe meets stripe consistency is not less than $$1 - \left(\frac{1}{2^{crclength}}\right)^m.$$

In an implementation, in a process of determining whether the target stripe has stripe consistency, among M system nodes that store the n first data blocks in the target stripe, some system nodes may already store corresponding CRC data blocks (that is, the system node already determines a second data block based on a first data block in advance, and determines a CRC data block of the second data block), and some system nodes may store no corresponding CRC data block. In this case, the system node that stores no corresponding CRC data block first performs, based on a corresponding transformation coefficient in the EC transformation matrix, EC transformation on a first data block stored on the system node, to obtain a second data block, then determines a CRC data block of the second data block, and then sends the CRC data block to the operation node. In addition, the system node that already stores the corresponding CRC data block also sends, to the operation node, the CRC data block stored on the system node. In this way, the operation node obtains the CRC data block corresponding to the target stripe, and determines, based on the CRC data block corresponding to the target stripe, whether the target stripe has stripe consistency. It should be noted that an arrangement order of the CRC data blocks corresponding to the target stripe is consistent with an arrangement order of the n first data blocks in the target stripe.

In the method for determining stripe consistency provided in this embodiment, the system node in the data storage system performs EC transformation on the n first data blocks included in the target stripe, to obtain the n groups of second data blocks, and calculates the corresponding n groups of CRC data blocks of the n groups of second data blocks. In this way, the operation node determines whether the n groups of CRC data blocks corresponding to the target stripe meet a linear relationship, to determine whether the target stripe has stripe consistency. Because the CRC data block is much smaller than the first data block included in the target stripe, the operation node obtains the CRC data block corresponding to the target stripe from the system node, so that bandwidth consumption can be reduced. In addition, because the CRC data block is small, the operation node determines, based on the CRC data block, whether the target stripe has stripe consistency, so that a calculation amount of the operation node can be reduced, and resource consumption can be reduced. In conclusion, in the method for determining stripe consistency provided in this embodiment, network resources consumed for determining stripe consistency can be reduced.

In the embodiments, function modules in the operation node and the system node may be obtained through division based on the foregoing method examples. For example, function modules may be obtained through division in correspondence with functions, or two or more functions may be integrated into one processing module. The integrated module may be implemented in a form of hardware or may be implemented in a form of a software function module. It should be noted that division into modules in the embodiments is an example and is merely a logical function division. During actual implementation, another division manner may be used.

Figure 7:
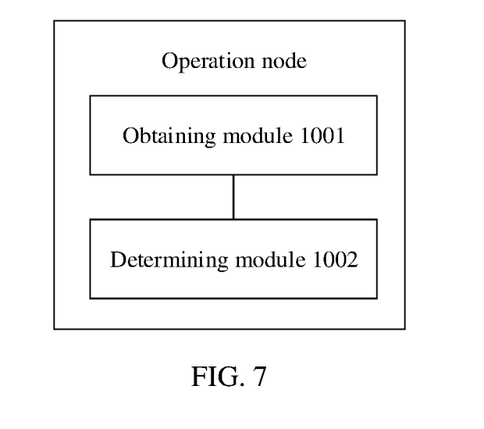
FIG. 7 is a schematic diagram 1 of a structure of an operation node according to an embodiment.

When each function module is obtained through division for each function, FIG. 7 is a schematic diagram of a possible structure of the operation node in the foregoing embodiment. As shown in FIG. 7, the operation node may include an obtaining module 1001 and a determining module 1002. The obtaining module 1001 may be configured to support the operation node in performing S201 in the foregoing method embodiment. The determining module 1002 may be configured to support the operation node in performing S202 and S203 (including S2031 and S2032) in the foregoing method embodiment. All related content of the steps in the foregoing method embodiments may be cited in function descriptions of corresponding function modules. Details are not described herein again.

Figure 8:
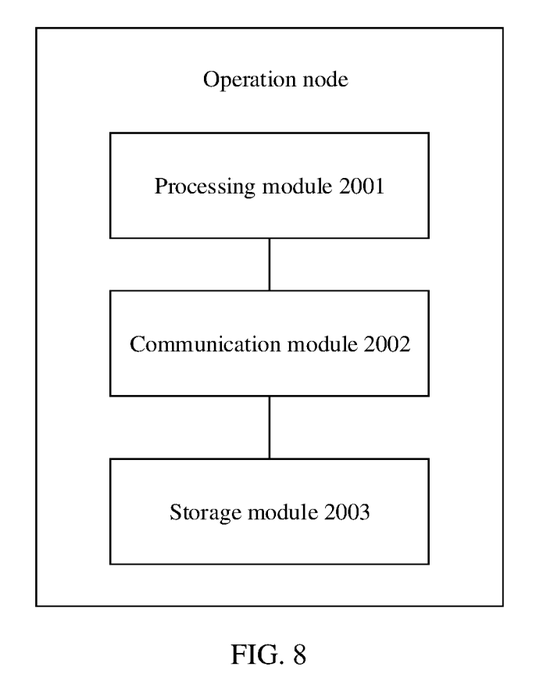
FIG. 8 is a schematic diagram 2 of a structure of an operation node according to an embodiment.

When an integrated unit is used, FIG. 8 is a possible schematic diagram of a structure of the operation node in the foregoing embodiments. As shown in FIG. 8, the operation node may include a processing module 2001 and a communications module 2002. The processing module 2001 may be configured to control and manage an action of the operation node. For example, the processing module 2001 may be configured to support the operation node in performing S201 to S203 (including S2031 and S2032) in the foregoing method embodiments, and/or another process of the technology described in the embodiments. The communications module 2002 may be configured to support communication between the operation node and another network entity. Optionally, as shown in FIG. 8, the operation node may further include a storage module 2003, configured to store program code and data of the operation node.

The processing module 2001 may be a processor or a controller (for example, the processor 101 shown in FIG. 2), and for example, may be a CPU, a general purpose processor, a DSP, an ASIC, an FPGA or another programmable logic device, a transistor logic device, a hardware component, or any combination thereof. The processing module may implement or execute various example logic blocks, modules, and circuits described with reference to content disclosed in the embodiments. The processor may alternatively be a combination of processors implementing a computing function, for example, a combination of one or more microprocessors, or a combination of a DSP and a microprocessor. The communications module 2002 may be a transceiver, a transceiver circuit, a communications interface, or the like (for example, the communications interface 103 shown in FIG. 2). The storage module 2003 may be a memory (for example, the memory 102 shown in FIG. 2).

When the processing module 2001 is the processor, the communications module 2002 is the transceiver, and the storage module 2003 is the memory, the processor, the transceiver, and the memory may be connected through a bus. The bus may be a peripheral component interconnect (PCI) bus, an extended industry standard architecture (EISA) bus, or the like. The bus may be classified into an address bus, a data bus, a control bus, and the like.

Figure 9:
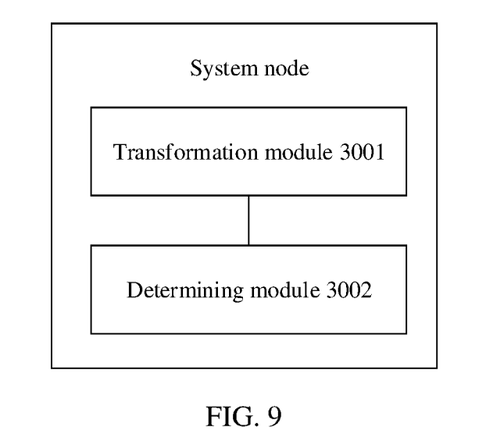
FIG. 9 is a schematic diagram 1 of a structure of a system node according to an embodiment.

When each function module is obtained through division for each function, FIG. 9 is a schematic diagram of a possible structure of the system node in the foregoing embodiment. As shown in FIG. 9, the system node may include a transformation module 3001 and a determining module 3002. The transformation module 3001 may be configured to support the system node in performing S101 (including S1011 and S1012) in the foregoing method embodiment. The determining module 3002 may be configured to support the system node in performing S102 in the foregoing method embodiment. All related content of the steps in the foregoing method embodiments may be cited in function descriptions of corresponding function modules. Details are not described herein again.

Figure 10:
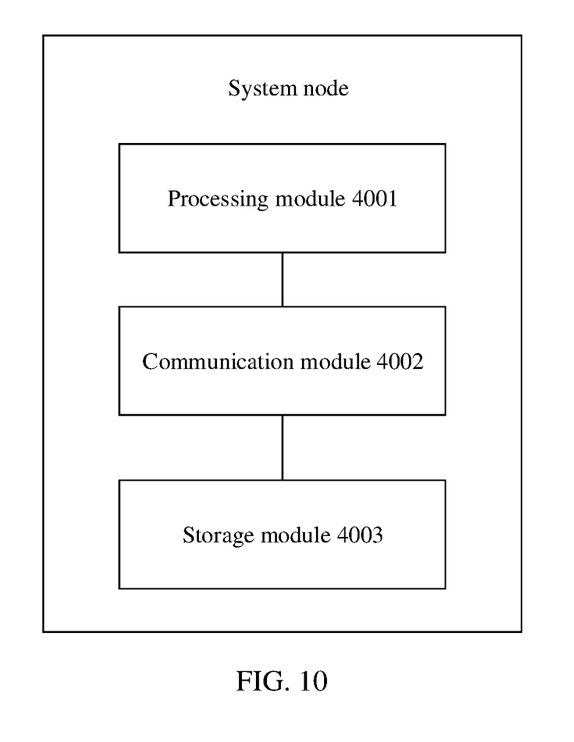
FIG. 10 is a schematic diagram 2 of a structure of a system node according to an embodiment.

When an integrated unit is used, FIG. 10 shows a possible schematic diagram of a structure of the system node described in the foregoing embodiments. As shown in FIG. 10, the system node may include a processing module 4001 and a communications module 4002. The processing module 4001 may be configured to control and manage an action of the system node. For example, the processing module 4001 may be configured to support the system node in performing S101 (including S1011 and S1012) and S102 in the foregoing method embodiments, and/or another process of the technology described in the embodiments. The communications module 4002 may be configured to support communication between the system node and another network entity. Optionally, as shown in FIG. 10, the system node may further include a storage module 4003, configured to store program code and data of the system node.

The processing module 4001 may be a processor or a controller (for example, the processor 101 shown in FIG. 2), and for example, may be a CPU, a general purpose processor, a DSP, an ASIC, an FPGA or another programmable logic device, a transistor logic device, a hardware component, or any combination thereof. The processing module may implement or execute various example logic blocks, modules, and circuits described with reference to content disclosed in the embodiments. The processor may alternatively be a combination of processors implementing a computing function, for example, a combination of one or more microprocessors, or a combination of a DSP and a microprocessor. The communications module 4002 may be a transceiver, a transceiver circuit, a communications interface, or the like (for example, the communications interface 103 shown in FIG. 2). The storage module 4003 may be a memory (for example, the memory 102 shown in FIG. 2).

When the processing module 4001 is the processor, the communications module 4002 is the transceiver, and the storage module 4003 is the memory, the processor, the transceiver, and the memory may be connected through a bus. The bus may be a PCI bus, an EISA bus, or the like. The bus may be classified into an address bus, a data bus, a control bus, and the like.

The operation node in the embodiments may be a controller of a storage array, a storage node in a distributed storage system, or a client. In another implementation, the embodiments may be implemented by specified hardware such as an FPGA or a GPU. This is not limited in the embodiments.

All or some of the foregoing embodiments may be implemented by software, hardware, firmware, or any combination thereof. When a software program is used to implement embodiments, embodiments may be implemented completely or partially in a form of a computer program product. The computer program product includes one or more computer instructions. When the computer instructions are loaded and executed on the computer, the procedure or functions according to the embodiments are all or partially generated. The computer may be a general-purpose computer, a dedicated computer, a computer network, or other programmable apparatuses. The computer instructions may be stored in a computer-readable storage medium or may be transmitted from a computer-readable storage medium to another computer-readable storage medium. For example, the computer instructions may be transmitted from a website, computer, server, or data center to another website, computer, server, or data center in a wired (for example, a coaxial cable, an optical fiber, or a digital subscriber line (DSL)) or wireless (for example, infrared, radio, or microwave) manner. The computer-readable storage medium may be any usable medium accessible by a computer, or a data storage device, such as a server or a data center, integrating one or more usable media. The usable medium may be a magnetic medium (for example, a floppy disk, a magnetic disk, or a magnetic tape), an optical medium (for example, a digital video disc (DVD)), a semiconductor medium (for example, a solid state drive (SSD)), or the like.

The foregoing description about implementations allows a person skilled in the art to understand that, for ease of description and brevity, division into the foregoing function modules is used as an example for description. In an actual application, the foregoing functions can be allocated to different modules and implemented according to a requirement. In other words, an inner structure of an apparatus is divided into different function modules to implement all or some of the functions described above. For a detailed working process of the foregoing system, apparatus, and unit, refer to a corresponding process in the foregoing method embodiments. Details are not described herein again.

In the several embodiments, it should be understood that the disclosed system, apparatus, and method may be implemented in other manners. For example, the described apparatus embodiment is merely an example. For example, division into the modules or units is merely logical function division and may be other division in actual implementation. For example, a plurality of units or components may be combined or integrated into another system, or some features may be ignored or not performed. In addition, the displayed or discussed mutual couplings or direct couplings or communication connections may be implemented through some interfaces. The indirect couplings or communication connections between the apparatuses or units may be implemented in electronic, mechanical, or other forms.

The units described as separate parts may or may not be physically separate, and parts displayed as units may or may not be physical units, may be located in one location, or may be distributed on a plurality of network units. Some or all of the units may be selected based on actual requirements to achieve the objectives of the embodiments.

In addition, function units in embodiments may be integrated into one processing unit, or each of the units may exist alone physically, or two or more units are integrated into one unit. The integrated unit may be implemented in a form of hardware or may be implemented in a form of a software function unit.

When the integrated unit is implemented in a form of a software function unit and sold or used as an independent product, the integrated unit may be stored in a computer-readable storage medium. Based on such an understanding, the solutions essentially, or the part contributing to the conventional technology, or all or some of the solutions may be implemented in the form of a software product. The computer software product is stored in a storage medium and includes several instructions for instructing a computer device (which may be a personal computer, a server, or a network device) or a processor to perform all or some of the steps of the methods described in the embodiments. The foregoing storage medium includes any medium that can store program code, such as a flash memory, a removable hard disk, a read-only memory, a random access memory, a magnetic disk, or an optical disc.

What is claimed is:

1. A method for determining stripe consistency, comprising:
   obtaining, by an operation node, n groups of cyclic redundancy check (CRC) data blocks corresponding to a target stripe, wherein an arrangement order of the CRC data blocks corresponding to the target stripe is consistent with an arrangement order of n first data blocks in the target stripe, the n first data blocks comprise k original data blocks and m erasure code (EC) data blocks of the k original data blocks, the n groups of CRC data blocks are respective CRC data blocks of n groups of second data blocks, one group of second data blocks in the n groups of second data blocks comprises m transformation results obtained by performing m times of EC transformation on one corresponding first data block, both k and m are positive integers, and n=m+k;
   determining, by the operation node, whether the target stripe has stripe consistency based on the CRC data blocks without providing the target stripe to the operation node in full;
   determining, by the operation node, whether the n groups of CRC data blocks meet a linear relationship;
   determining, by the operation node, that the target stripe has stripe consistency when the n groups of CRC data blocks meet the linear relationship; and
   sending, by a system node, the groups of CRC data blocks to the operation node.

2. The method for determining stripe consistency according to claim 1, wherein a $j^{th}$ time of EC transformation is performed on each of the n first data blocks $\{B_0, B_1, \ldots, B_{n-1}\}$ comprised in the target stripe, to obtain n second data blocks $\{\tilde{B}_0^j, \tilde{B}_1^j, \ldots, \tilde{B}_{n-1}^j\}$, respective CRC data blocks of the n second data blocks $\{\tilde{B}_0^j, \tilde{B}_1^j, \ldots, \tilde{B}_{n-1}^j\}$ are $\{C_0^j, C_1^j, \ldots, C_{n-1}^j\}$, and j=1,2, . . . ,m; and
   determining, by the operation node, whether the n groups of CRC data blocks meet the linear relationship further comprises:
   determining, by the operation node, whether the n groups of CRC data blocks meet $C_0^j \oplus C_1^j \oplus \ldots \oplus C_{n-1}^j = 0$, where j=1, 2, . . . , m, and $\oplus$, wherein j=1,2, . . . ,m, and $\oplus$ indicates an exclusive OR operation.

3. The method for determining stripe consistency according to claim 1, wherein determining, by the operation node, that the target stripe has stripe consistency further comprises:
   determining, by the operation node based on whether the n groups of CRC data blocks meet the linear relationship, whether the n groups of second data blocks meet the linear relationship; and
   determining, by the operation node, that the target stripe has stripe consistency when the n groups of second data blocks meet the linear relationship.

4. An operation node, comprising:
   an interface; and
   a processor coupled to the interface and configured to:
   determine, by the operation node, whether the target stripe has stripe consistency based on cyclic redundancy check (CRC) data blocks without providing the target stripe to the operation node in full;
   obtain n groups of the cyclic redundancy check (CRC) data blocks corresponding to the target stripe, wherein an arrangement order of the CRC data blocks corresponding to the target stripe is consistent with an arrangement order of n first data blocks in the target stripe, the n first data blocks comprise k original data blocks and m erasure code (EC) data blocks of the k original data blocks, the n groups of CRC data blocks are respective CRC data blocks of n groups of second data blocks, one group of second data blocks in the n groups of second data blocks comprises m transformation results obtained by performing m times of EC transformation on one corresponding first data block, n is a positive integer greater than or equal to 2, m is a positive integer less than n, and n=m+k, determine whether the n groups of CRC data blocks meet a linear relationship, and when the n groups of CRC data blocks meet the linear relationship;

determine that the target stripe has stripe consistency; and send the groups of CRC data blocks to the operation node.

5. The operation node according to claim 4, wherein a $j^{th}$ time of EC transformation is performed on each of the n first data blocks $\{B_0, B_1, \ldots, B_{n-1}\}$ comprised in the target stripe, to obtain n second data blocks $\{\tilde{B}_0^j, \tilde{B}_1^j, \ldots, \tilde{B}_{n-1}^j\}$, respective CRC data blocks of the n second data blocks $\{\tilde{B}_0^j, \tilde{B}_1^j, \ldots, \tilde{B}_{n-1}^j\}$ are $\{C_0^j, C_1^j, \ldots, C_{n-1}^j\}$, and j=1,2, . . . ,m; and the processor is further configured to determine whether the n groups of CRC data blocks meet $C_0^j \oplus C_1^j \oplus \ldots \oplus C_{n-1}^j=0$, where j=1, 2, . . . , m, and $\oplus$, wherein j=1,2, . . . , m, and $\oplus$ indicates an exclusive OR operation.

6. The operation node according to claim 4, wherein the processor is further configured to:

determine, based on whether the n groups of CRC data blocks meet the linear relationship, whether the n groups of second data blocks meet the linear relationship, and when the n groups of second data blocks meet the linear relationship, determine that the target stripe has stripe consistency.

7. A storage system, comprising an operation node and a system node; wherein the operation node determines whether a target stripe has stripe consistency based on cyclic redundancy check (CRC) data blocks without receiving the target stripe in full and is configured to:

obtain n groups of the cyclic redundancy check (CRC) data blocks corresponding to the target stripe, wherein an arrangement order of the CRC data blocks corresponding to the target stripe is consistent with an arrangement order of the n first data blocks in the target stripe, the n first data blocks comprise k original data blocks and m erasure code (EC) data blocks of the k original data blocks, the n groups of CRC data blocks are respective CRC data blocks of n groups of second data blocks, one group of second data blocks in the n groups of second data blocks comprises m transformation results obtained by performing m times of EC transformation on one corresponding first data block, n is a positive integer greater than or equal to 2, m is a positive integer less than n, and n=m+k, and determine whether the n groups of CRC data blocks meet a linear relationship; and when the n groups of CRC data blocks meet the linear relationship, determine that the target stripe has stripe consistency;

the system node is configured to:

perform EC transformation on p first data blocks on the system node, to obtain p groups of second data blocks, wherein the p first data blocks are data blocks in the target stripe, the n first data blocks are stored on at least one system node, one group of second data blocks in the p groups of second data blocks comprises m transformation results obtained by performing m times of EC transformation on one corresponding first data block, p is a positive integer less than or equal to n, and n=m+k;

determine respective CRC data blocks of the p groups of second data blocks, to obtain p groups of CRC data blocks, wherein the p groups of CRC data blocks are used to determine whether the target stripe has stripe consistency; and send the p groups of CRC data blocks to the operation node.

8. The storage system according to claim 7, wherein a $j^{th}$ time of EC transformation is performed on each of the n first data blocks $\{B_0, B_1, \ldots, B_{n-1}\}$ comprised in the target stripe, to obtain n second data blocks $\{\tilde{B}_0^j, \tilde{B}_1^j, \ldots, \tilde{B}_{n-1}^j\}$, respective CRC data blocks of the n second data blocks $\{\tilde{B}_0^j, \tilde{B}_1^j, \ldots, \tilde{B}_{n-1}^j\}$ are $\{C_0^j, C_1^j, \ldots, C_{n-1}^j\}$, and j=1,2, . . . , m; and the operation node is further configured to determine whether the n groups of CRC data blocks meet $C_0^j \oplus C_1^j \oplus \ldots \oplus C_{n-1}^j=0$, where j=1, 2, . . . , m, and $\oplus$, wherein j=1,2, . . . ,m, and $\oplus$ indicates an exclusive OR operation.

9. The storage system according to claim 7, wherein the operation node is further configured to:

determine, based on whether the n groups of CRC data blocks meet the linear relationship, whether the n groups of second data blocks meet the linear relationship, and when the n groups of second data blocks meet the linear relationship, determine that the target stripe has stripe consistency.

* * * * *